United States Patent [19]

Bezjak

[11] Patent Number: 5,091,708

[45] Date of Patent: Feb. 25, 1992

[54] TRANSMISSION LINE TRANSFORMER

[75] Inventor: Greg W. Bezjak, Stratford, Conn.

[73] Assignee: North American Philips Corporation, New York, N.Y.

[21] Appl. No.: 559,811

[22] Filed: Jul. 30, 1990

[51] Int. Cl.⁵ .............................................. H03H 7/42
[52] U.S. Cl. ..................................... 333/26; 333/136; 324/318
[58] Field of Search ...................... 333/25, 26, 33, 125, 333/128, 136, 219; 330/286; 324/307, 318, 322; 336/200

[56] References Cited

PUBLICATIONS

J. Sevick, "Baluns", Transmission Line Transformers, Publ. by American Radio Relay League, 1987, Chapter 8, pp. 8-1-8-7.
The ARRL Antenna Book, "Transmission Lines", Publ. by The American Radio Relay League, 1974, pp. 115-116.
R. K. Blocksome, "Practical Wideband RF Power Transformers, Combiners, & Splitters", Proceedings—Fexpo Feast, Nov. 10-12, 1986, pp. 1-21.

Primary Examiner—Eugene R. LaRoche
Assistant Examiner—Seung Ham
Attorney, Agent, or Firm—William Squire

[57] ABSTRACT

A birdcage knee coil operated in quadrature in an NMR imaging system includes a pair of like butterfly coils each formed from a strip transmission line formed on a common dielectric substrate. The pair inputs the quadrature signals created by the birdcage coil to a combiner output circuit. Each butterfly coil of the pair comprises a pair of wings of like area connected by a common transmission line so that currents induced by a magnetic field on the ground conductors of one wing oppose and cancel the currents induced by that field on the ground conductors of the other wing. The transmission line forming each butterfly coil has opposing ground conductors of the same transverse width with a center conductor equally spaced between the ground conductors and a transverse width of about one tenth that of the ground conductors. The pair of coils are arranged symmetrically relative to the birdcage coil to provide an electrically balanced system.

23 Claims, 2 Drawing Sheets

TRANSMISSION LINE TRANSFORMER

BACKGROUND OF THE INVENTION

1. Field of the Invention

The present invention relates to transmission line transformers, and particularly, to transformers for use in a magnetic field.

2. Description of the Prior Art

A particular type of transmission line transformer is known as the balun (balanced-to-unbalanced). A balun is used to match unbalanced lines to balanced lines. For example, a typical 300 ohm twin lead line (balanced) used in television antenna systems requires a balun to couple the line to a 75 ohm coaxial cable (unbalanced). Baluns may be 1:1 for matching 50 ohm lines to 50 ohm loads or some other ratio in accordance with a given system. A dipole antenna requires a balun for coupling to a coaxial cable. Often baluns use ferrite cores to enhance their operation. Baluns may be linear employing ferrite rod cores or torroidal employing ferrite ring cores. Reference is made to a more detailed discussion of baluns in "Transmission Line Transformers" by Jerry Sevick, Chapter 8, the American Radio Relay League, Newington, Conn. 1987; "The ARRL Antenna Handbook," American Radio Relay League, 1974, pages 115, 116 and Proceedings RF Expo East, Nov. 10-12, 1986, Boston, Mass., "Practical Wideband RF Power Transformers, Combiners, and Splitters" by R. K. Blocksome, pages 1-21.

In NMR (Nuclear Magnetic Resonance) systems, antennas are frequently used to receive rf signals generated in a static magnetic Bo field. Certain of these antennas are referred to as surface coils and take a variety of shapes and configurations. One type of such a coil is a birdcage coil comprising a pair of spaced rings coupled by a set of parallel linear rods. The coil includes spaced capacitors for tuning the coil to a given rf frequency, typically about 64 MHz. Such coils may further include means for operating the coils linearly or in quadrature, the latter arrangement increasing the signal-to-noise ratio in a known manner.

In an NMR system a body coil which creates the Bo field is a large birdcage which receives the body of a patient being examined. The body coils are usually of limited dimensions for receiving a patient table with the patient lying supine or prone on the table. Typically such body coils are about 20-24 inches (50-60 cm) in internal diameter. That leaves about 12-14 inches (30-35 cm) above the table for the smaller surface or birdcage coil for examining a particular part of the body. The smaller birdcage coil may be used locally to examine a persons head, for example. The head is inside the coil while in the Bo field and coaxial cables connect the local coil to the imaging system outside the field. Such cables in some cases may be connected to a balun before connection to instrumentation. The balun is sometimes referred to as a trap. The balun is used to prevent rf currents that may be induced on the cable ground shield in the rf field generated by a body, e.g., the head, in response to the system generated rf flux. Such currents need be prevented because they degrade the efficiency of the local coil and because only a small amount of power is available from body tissue for sensing by the local coil. Typically all of this power would go toward producing currents in the local coil. These currents are amplified and sent on to the rest of the NMR system. Any currents induced in the cable shield represent a loss of power and must be eliminated.

In one case the balun is the coaxial cable coiled into a transformer and mounted adjacent to the birdcage coil. This is not entirely satisfactory because a considerable length of cable is present between the balun and local birdcage coil. In other cases, the local birdcage coil is constructed with a flat copper sheet material end in place of one of the rings. The coaxial cables are connected to the coil via this copper sheet which serves as a shield between the cables and the coil.

To further avoid generating unwanted induced currents in the coaxial cabling, the cables may be connected to the local birdcage coil normal to the coil longitudinal axis and to the Bo field for a distance of about the birdcage diameter, typically about 8 inches (20 cm). However, this is usually not practical due to the limited amount of space available within the body coil as discussed above. Additionally, forming the coaxial cable into a balun is also not practical in certain implementations because the cables limit the balun diameter to too large a dimension for use in the limited space due to the limited bend radius of the cable.

In the present implementation, it is desired to use the birdcage coil in quadrature for examining the knee. This requires both ends of the coil to be open to permit the leg to pass through. This prohibits the use of the copper shield. The use of cables normal to the cage is also prohibited in this case because of lack of room in the body coil. The use of the balun arrangement by coiling the coaxial cable in a region next to the birdcage coil is also not satisfactory for the reasons given.

SUMMARY OF THE INVENTION

A transmission line transformer construction in accordance with the present invention comprises a transmission line having at least one ground conductor, a dielectric member and a signal conducting conductor. The signal conducting conductor is spaced from the at least one ground conductor by the dielectric member, the line being formed into a first planar coil for receiving a radio frequency signal at an input thereto. A second planar coil is formed from the transmission line and coplanar with the first coil for outputting the signal at an output therefrom. A conductor of one coil corresponds to and is in common with a conductor of the other coil. The coils are oriented, positioned and dimensioned relative to one another so that in the presence of a given magnetic field inducing a current in each coil ground conductor, the current induced in the first coil opposes the current induced in the second coil. By making the coils planar they take little room and may be placed in the magnetic field adjacent to the birdcage. By making the coils symmetrical the opposing currents cancel one another. Two pairs of such coils may be symmetrically arranged relative to a birdcage antenna operated in quadrature, a different pair corresponding to a different one of the orthogonal coils.

IN THE DRAWING

DESCRIPTION OF THE PREFERRED EMBODIMENT

Figure 1:
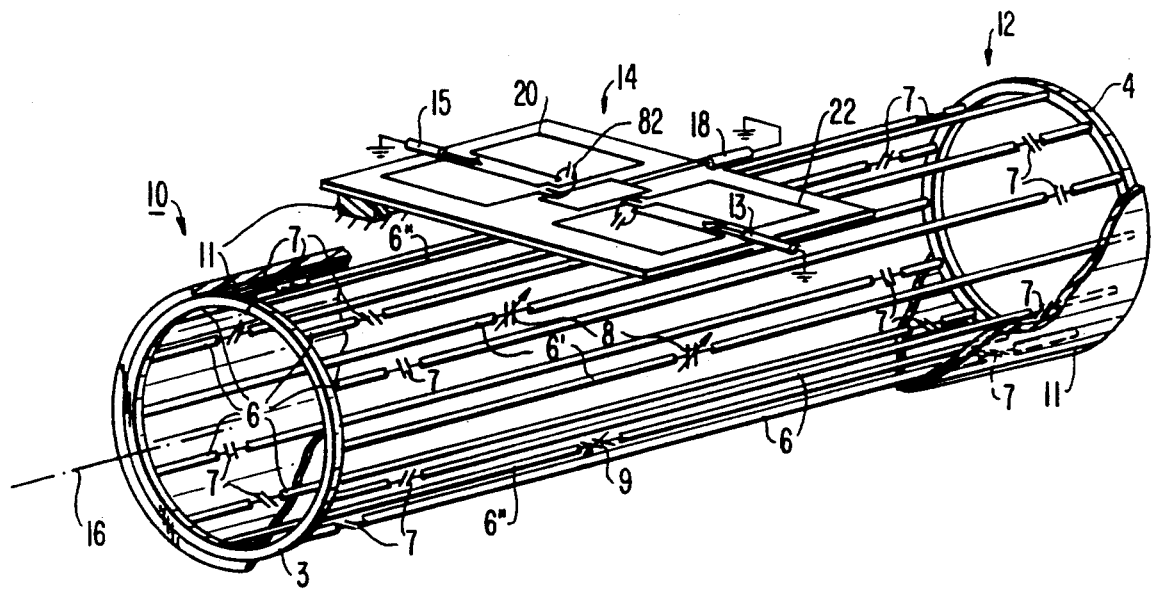
FIG. 1 is an isometric view of a transformer construction according to an embodiment of the present invention for use with an NMR birdcage coil system operated in quadrature.

In FIG. 1, antenna system 10 comprises a birdcage antenna 12 and output circuit 14. Birdcage antenna 12 comprises a pair of spaced parallel equally dimensioned and equal inductance circular conductors 3 and 4. The conductors 3 and 4 are connected by parallel rods 6. The rods include capacitances 7 for rough tuning the coil to its operating frequency, typically 64 MHz. A variable capacitance 8 is in each of two 180° spaced rods 6' and a variable capacitance 9 (only one bin shown) is in each of two 180° spaced rods 6''. These capacitances tune the coils to which they are associated to the same frequency. PIN diodes and associated circuity (not shown) electrically divide the rods into orthogonal coils for responding to magnetic fields oriented 90° to one another. Capacitance 8 are associated with one of these coils and capacitance. 9 are associated with the other coil. A housing 11 partially shown forms the antenna into an enclosed cylinder which supports the output circuit 14. The antenna 12 has a longitudinal axis 16.

System 10 is for use in an NMR imaging system (not shown) particularly for examining the knee of a patient lying on a table positioned within a magnet which generates a Bo field. The Bo field is parallel to the longitudinal axis 16. RF pulses are generated by means not shown which produce rf magnetic response pulses in the knee under examination. The rf response pulses are detected by the coils of antenna 12 in quadrature which supplies the detected signals to circuit 14 via coaxial cables 13 and 15. The two coils are physically oriented 90° relative to each other about axis 16. Cable 13 is connected to one of the two coils and cable 15 is connected to the other for receiving the detected 90° out of phase rf signals. Circuit 14 amplifies and phase combines the signals appearing on cables 13 and 15. The combined signals are supplied to utilization equipment (not shown) outside the Bo field via output coaxial cable 18.

Cable 18 is situated within the rf field generated by the knee coil in response to the tissue generated rf field, and therefore, exhibits induced currents on its ground conductor. These currents represent a loss and detrimentally affect the operation of the birdcage coil system unless otherwise precluded.

Figure 2:
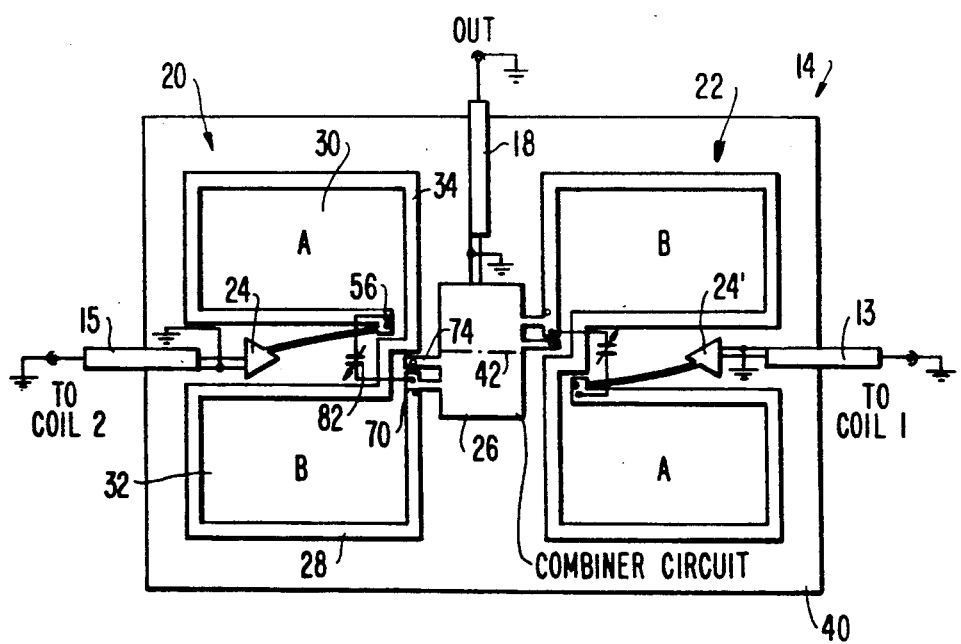
FIG. 2 is a plan view of the transformer construction of FIG. 1 illustrating a pair of transformers each coupled to a different coil of the birdcage system.
Figure 3:
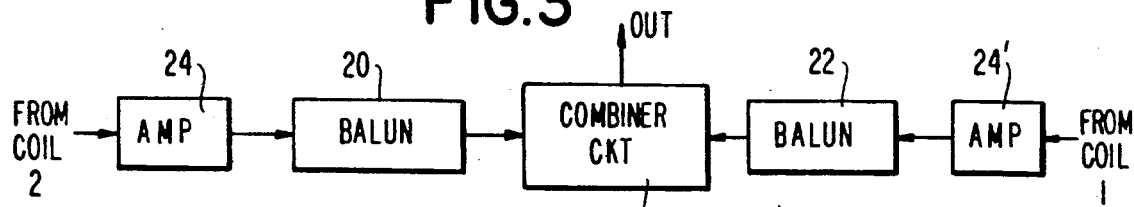
FIG. 3 is a schematic circuit diagram of the circuit shown in FIG. 2 coupled to the birdcage coil system of FIG. 1.

In FIG. 2, circuit 14 includes a first transmission line transformer balun 20 and a second balun 22 which is identical to balun 22. Balun 20 receives an input signal from one of the antenna coils via cable 15 and preamplifier 24. Balun 22 receives an input signal from the other of the antenna coils via cable 13 and preamplifier 24'. Parts in the different figures with a primed reference numeral are identical to parts with the same reference numeral unprimed. The outputs of baluns 20 and 22 are applied to combiner circuit 26 which combines the 90° out of phase signals and applies the combined signals to output cable 18. FIG. 3 shows in block diagram form the circuit 14 of FIG. 2. Prior art systems mentioned in the introductory portion above in contrast provide a balun at the output of the combiner circuit which is unsatisfactory in many implementations, notwithstanding that such a balun is formed from a coiled coaxial output cable and suffers the drawback of being relatively large.

The baluns 20 and 22, in contrast to coiled coaxial cables and their attendant drawbacks, are formed from planar transmission lines, are electrically isolated from one another, take up little room in the region next to the antenna and provide isolation closer to the input cables 13 and 15 than prior art systems, thus exposing less cabling to the detrimental effects of the rf field. Representative balun 20 is shown in more detail in FIGS. 4–7. Balun 20 comprises a planar transmission line 28 formed into a butterfly coil comprising two wings 30 and 32. The transmission line 28 forming the wings 30 and 32 is continuous having an identical cross-section throughout. In FIG. 5, representative cross-section of transmission line 28 comprises planar parallel outer ground conductors 34 and 36 and planar central signal conductor 38 supported on a planar dielectric sheet 40. Sheet 40 may be phenolic or any other dielectric material used in strip transmission lines. Conductors 34, 36 and 38 are copper foils typically used in printed circuits and in planar transmission lines. Conductors 34, 36 and 38 are of the same thickness, e.g., 2 mils. Conductor 38 has a transverse width from left to right in the figure of about one tenth the transverse width of conductors 34 and 36 which have the same width. By way of example, conductor 38 has a width of about 0.040 inch and conductors 34 and 36 have a width of about 0.40 inch. Conductors 34, 36 and 38 may be formed by etching each conductor from a copper clad dielectric layer. The layers are then bonded into a single layer structure as shown. Construction of similar multilayer boards is known.

Figure 4:
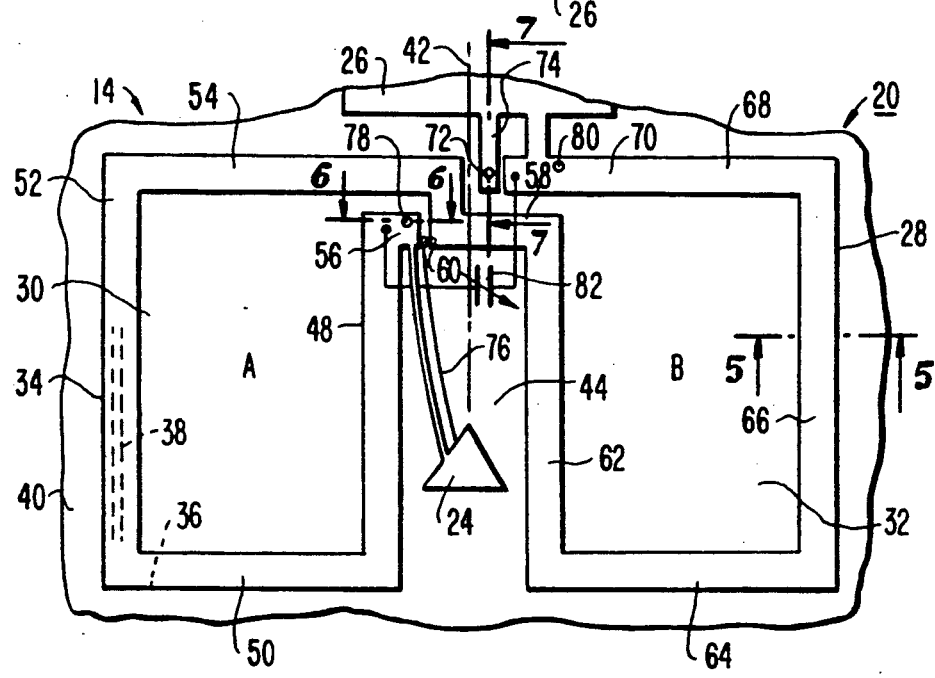
FIG. 4 is a more detailed plan view of a representative one of the transformers of FIG. 2.
Figure 5:
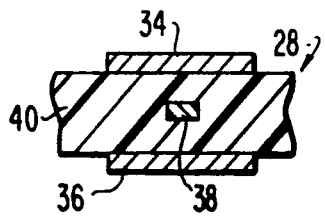
FIG. 5 is a sectional view taken along lines 5—5 of FIG. 4.

In FIG. 4, wings 30 and 32 enclose respective areas A and B. Areas A and B are identical and symmetrical relative to axis 42. Axis 42 is the transverse axis of symmetry of the antenna 12 (FIG. 1). That is, axis 42 is normal to axis 16 and lies in a plane which divides the antenna into two symmetrical halves. Wing 30 lies in one half and wing 32 lies in the other half. The line 28 in forming the wings follows a tortuous path which creates a central region 44 between the two wings. The amplifier 24 is on dielectric 40 in region 44. The amplifier 24 may be an FET transistor, for example. Wing 30 comprises a set of linear transmission lines 48, 50, 52 and 54 at right angles to each other forming a rectangular coil. Wing 30 further includes a leg 56 which forms a terminal for conductors 34, 36 and 38 (FIG. 4). Transmission line 54 includes a bent extension 58 which directly connects to wing 32. Leg 56 is sufficiently spaced from the extension 58 an amount to provide electrical isolation therebetween. For example, the spacing between leg 56 and extension 58 may be about 100 mils and is not critical. A terminal 60 is formed in this space for connecting the amplifier 24 output terminal to the center conductor 38 of the leg 56 transmission line. For this purpose, conductor 38 extends beyond conductors 34 and 36 somewhat.

Extension 58 connects to transmission line 62 of wing 32. Wing 32 comprises lines 62, 64, 66 and 68 connected at right angles as shown. Line 68 terminates at terminal leg 70 which is closely spaced to extension 58 similar to the spacing with leg 56. The center conductor 38 of leg 70 extends beyond ground conductors 34 and 36 so as to be connected to terminal 72. Terminal 72 is connected to combiner circuit by conductor 74 on one side of dielectric 40. The output of amplifier 24 is connected to terminal 60 by wire 76. The input of amplifier 24 is connected to cable 15 by a connector (not shown). The ground conductors 34 and 36 of terminal leg 56 are connected by terminal 78 and the ground conductors of leg 70 are connected by terminal 80. In FIG. 2, a variable isolation capacitor 82 is connected to ground conductor 34 of legs 56 and 70.

Figure 6:
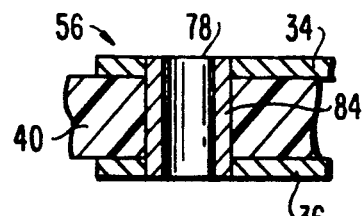
FIG. 6 is a sectional view taken along lines 6—6 of FIG. 4.
Figure 8:
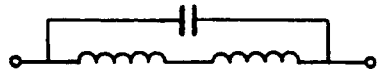
FIG. 8 is the equivalent circuit of a representative transformer shown in FIG. 4.

In FIG. 6, a representative terminal 78 connecting the ground conductors 34 and 36 comprises a plated through hole having a metal plated conductor 84 which electrically connects conductors 34 and 36. The center conductor is not in the region of terminal 78. In this way the capacitor 82 is coupled at opposing ends to both conductors 34 and 36 at the ends of the two wings 30 and 32. This produces with the coils formed by the wings the circuit of FIG. 8. The capacitor further increase the impedance of the balun which otherwise would require an increased undesirable balun dimension to create an equivalent impedance.

Figure 7:
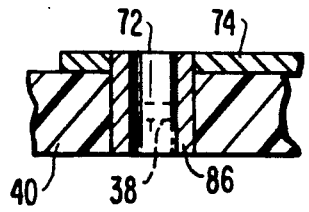
FIG. 7 is a sectional view taken along lines 7—7 of FIG. 4.

In FIG. 7, a representative terminal 72 for connection to the center conductor 38 comprises a plated through hole having a metal plated conductor 86 which connects the conductor 38 with the conductor 74 on the external surface of the dielectric 40. Terminal 60 is similar except it forms a convenient terminal for receiving the wire connected to the amplifier 24 output. In the alternative, terminal 60 may be similar to terminal 72. A printed conductor connects the amplifier 24 to conductor 34 for completing the ground circuit to the amplifier.

The entire structure forming circuit 14 comprising the dielectric 40 and its associated circuitry described above including connectors for the coaxial input and output cables forms a compact printed circuit construction. The circuit 14 is conveniently secured to the support 11 of the antenna housing in the position and orientation shown. Because the circuit 14 construction is relatively flat and compact it can be mounted centrally of the antenna 12 so that it protrudes above the rods a minimum distance. Also the antenna is open at both ends for receiving the leg of a patient therethrough. In the alternative, the antenna could also be used as a head coil.

In operation, the system 10 of FIG. 1 is placed on a patient table within a Bo field. The magnetic rf pulses sensed by the antenna have flux lines normal to the plane of the coils formed by wings 30 and 32. In FIG. 2, for example, assume an rf magnetic pulse field is perpendicular to the drawing sheet coming toward the reader. The field in wing 30 creates currents on conductors 34 and 36 in a given direction. The field in wing 32 creates currents on the conductors 34 and 36 of the same magnitude but in opposing directions, cancelling one another. These currents flow on the outer surface of the ground conductors. The signal and associated ground currents, however, flow on the central conductor and inner surfaces of the outer ground conductors, respectively, and are not affected by the external fields nor by the fields created by these signal currents in accordance with known theory for baluns. The capacitor 82 in combination with the balun 20 across which the capacitor is connected provides high isolation impedance for current induced on the balun ground conductors outer surfaces. For example, this impedance may be about 12 K. ohms which provides an acceptable minimum isolation impedance. The resulting balun structure effectively stops the flow of induced currents along the output cable ground shield.

While the invention has been described in connection with a quadrature antenna system it is equally useful with a linear antenna system. Further the balun of the present invention may be used with non-NMR antennas, e.g., dipole antennas. It should be noted that it is important that the ground conductors 34 and 36 be of the same transverse width. If the butterfly ground conductor were formed on only one side of a dielectric then the signal currents are not confined entirely to the surface of the ground conductor near, i.e., facing, the center conductor. In this case, the desired signal "sees" the high impedance balun, which in effect prevents both the desired signal currents along with the undesired unbalanced ground current. This was surprising to the present inventor. While a particular butterfly configuration has been described others may be used. For example, the space for the amplifiers may be reduced or enlarged or the number and shape of the turns changed in accordance with a given implementation. Also, in certain implementations the butterfly turns may be formed by other than a planar transmission line, e.g., coaxial lines formed into planar butterfly coils.

What is claimed is:

1. A transmission line transformer construction comprising:
   a transmission line having at least one ground conductor, a dielectric member and a signal conducting conductor, said signal conducting conductor being spaced from the at least one ground conductor by said dielectric member, said line being formed into a first planar coil for receiving a radio frequency signal at an input thereto; and
   a second planar coil formed from said transmission line and coplanar with said first coil for outputting said signal at an output therefrom, said at least one ground and signal conducting conductors each having a first portion which forms a conductor of one coil and having a second portion which forms a conductor of the other coil, said coils being oriented, positioned and dimensioned relative to one another so that in the presence of a given magnetic field inducing a current in each coil ground conductor portion, the current induced in a first coil conductor opposes the current induced in that conductor of the second coil.

2. The construction of claim 1 further including capacitance means coupled to said at least one ground conductor at said input and output for isolating said at least one ground conductor relative to radio frequency currents between said input and output.

3. The construction of claim 1 wherein said coils are arranged so that a current flowing in said transmission line flows through one coil in a clockwise direction and counterclockwise through the other coil relative to an axis normal to the plane of the coils and through the center of each coil.

4. The construction of claim 1 wherein each coil substantially encloses a given area of about the same magnitude.

5. The construction of claim 4 wherein said coils are rectangular.

6. The construction of claim 1 wherein said dielectric member is a planar sheet material, said signal conductor being centrally disposed in the sheet material between opposing broad surface of the material, said at least one ground conductor comprises a first conductor on one of said broad surfaces and a second conductor on the other opposing broad surface.

7. The construction of claim 6 wherein said transmission line has first and second terminating ends, each end corresponding to a different coil and spaced from a transmission line portion forming that coil, said construction including connection means ohmically connecting said first and second conductors a the first end and said first and second conductors at the second end.

8. The construction of claim 6 including terminal means ohmically connected to said signal conductor at each said end.

9. The construction of claim 6 wherein said first and second conductors have a transverse width of about ten times the magnitude of the transverse width of the center conductor.

10. The construction of claim 1 wherein said coils each comprise one turn, the signal conductor and the at least one ground conductor of the turn of one coil being about the same dimensions of the corresponding conductors of the turn of the other coil.

11. The construction of claim 1 including a second transmission line formed into third and fourth coils arranged in mirror image fashion relative to said first and second coils, a current induced in the third coil in response to said magnetic field being opposed by the current induced in the fourth coil by said magnetic field.

12. The construction of claim 11 including amplifier means for applying said radio frequency signal applied to the input of the first and third coils and signal combiner means for combining the signal outputted from the second and fourth coils.

13. The construction of claim 12 including coaxial connection means for coupling at least one coaxial cable to said amplifier means and at least one coaxial cable to said combiner means.

14. The construction of claim 1 further including a birdcage antenna coil means coupled to said first and second coils for generating and applying an rf signal to said first coil.

15. A transmission line transformer construction comprising:

a transmission line comprising a signal conductor spaced from at least one ground conductor by a dielectric member, said line forming first and second coplanar planar coils in which each conductor thereof has a first portion in the first coil and a second portion in the second coil, said coils being oriented, positioned and dimensioned relative to one another so that in the presence of a given magnetic field, a current is induced in at least one conductor of each coil wherein the current induced in a first coil conductor portion flows in a direction opposing the current direction of the current induced in the portion of that conductor in the second coil, one of said coils for receiving a radio frequency signal at an input thereto, the other coil for outputting said received signal at an output therefrom;

means for applying said signal to said input; and means for receiving said signal at said output.

16. The construction of claim 15 including capacitance means coupled to said input and output across said coils.

17. The construction of claim 15 wherein said transmission line is a strip line comprising a planar electrically conductive at least one ground conductor spaced from a planar electrical signal conductor by a planar dielectric.

18. The construction of claim 17 wherein said signal conductor is between two ground conductors.

19. The construction of claim 18 wherein said two ground conductors are substantially the same in dimension and orientation.

20. The construction of claim 19 wherein said coils each comprise a plurality of linear conductors connected to each other at right angles.

21. The construction of claim 20 wherein said linear conductors are planar sheet material, each of substantially the same given transverse width.

22. A balun transformer construction for use with a quadrature rf coil in an NMR apparatus, said rf coil having a central axis, said construction comprising:

first and second baluns each comprising first and second like planar coplanar coils, each coil including a transmission line comprising a signal conductor and at least one ground conductor spaced from the signal conductor by a dielectric member; and means for securing the baluns to said quadrature rf coil with the first coils of each balun arranged symmetrical with the second coils relative to said central axis.

23. The construction of claim 22 including amplifier means for receiving and amplifying at least one rf signal from said rf coil and for applying the at least one amplified signal to each said balun, said baluns for passing said at least one amplified signal to an output thereof and signal combining means for phase combining the amplified signals at said outputs of said first and second baluns.

* * * * *